United States Patent [19]
Watanabe et al.

[11] Patent Number: 4,781,765
[45] Date of Patent: Nov. 1, 1988

[54] PHOTOVOLTAIC DEVICE

[75] Inventors: Kaneo Watanabe, Kyoto; Yukio Nakashima, Osaka, both of Japan

[73] Assignee: Sanyo Electric Co., Ltd., Osaka, Japan

[21] Appl. No.: 96,944

[22] Filed: Sep. 14, 1987

[30] Foreign Application Priority Data

Sep. 26, 1986 [JP] Japan .................. 61-228798

[51] Int. Cl.⁴ .............................. H01L 31/06
[52] U.S. Cl. .................... 136/249; 136/258; 357/30
[58] Field of Search ............. 136/249 TJ, 258 AM; 357/30 J, 30 K

[56] References Cited

U.S. PATENT DOCUMENTS

| | | | |
|---|---|---|---|
| 4,272,641 | 6/1981 | Hanak | 136/249 TJ |
| 4,338,482 | 6/1983 | Hamakawa et al. | 136/258 AM |
| 4,342,044 | 7/1982 | Ovshinsky et al. | 357/2 |
| 4,451,838 | 5/1984 | Yamazaki | 357/2 |
| 4,476,346 | 10/1984 | Tawada et al. | 136/249 TJ |
| 4,500,744 | 2/1985 | Nozaki et al. | 136/258 AM |
| 4,531,015 | 7/1985 | Wong et al. | 136/258 AM |
| 4,705,912 | 11/1987 | Nakashima et al. | 136/258 |
| 4,718,947 | 1/1988 | Arya | 136/258 |

FOREIGN PATENT DOCUMENTS

| | | | |
|---|---|---|---|
| 0111247 | 6/1984 | European Pat. Off. | 136/258 AM |
| 3242831 | 5/1984 | Fed. Rep. of Germany | 136/258 AM |
| 3408317 | 10/1984 | Fed. Rep. of Germany | 136/258 AM |

OTHER PUBLICATIONS

Kuwana et al., "Development of Amorphous Si Solar Cells in Japan", *Proceedings 3rd E.C. Photovoltaic Solar Energy Conf.*, 1980, pp. 309–316.

Y. Tawada, "A New Stable a-SIC/a-SiH Heterojunction Solar Cells", *Eighteenth IEEE Photovoltaic Specialists Conference—1985*, pp. 1712–1713.

*Primary Examiner*—Aaron Weisstuch
*Attorney, Agent, or Firm*—Robert M. Asher

[57] ABSTRACT

A photovoltaic device comprises a transparent front electrode, an amorphous semiconductor film containing at least one p-i-n junction and a metallic back electrode, wherein the n-layer neighboring on the back electrode includes at least one first type sub-layer of an alloyed amorphous silicon which contains not only hydrogen and a dopant for n-conductivity type but also at least one element selected from nitrogen, oxygen and carbon, and at least one second type sub-layer of an amorphous silicon which contains hydrogen and a dopant for n conductivity type.

18 Claims, 4 Drawing Sheets

PHOTOVOLTAIC DEVICE

BACKGROUND OF THE INVENTION

1. Field of the Invention

This invention relates to a photovoltaic device for converting optical energy into electric energy and more particularly to a photovoltaic device which is improved in resistance to thermal degradation of the conversion efficiency without deteriorating the initial conversion efficiency.

2. Description of the Prior Art

A photovoltaic device can be composed mainly of amorphous silicon deposited from a gas containing a silicon compound such as $SiH_4$, $Si_2H_6$ or $SiF_4$. Although such a photovoltaic device composed mainly of amorphous silicon can be manufactured with its larger area at lower cost and thus is preferable as a solar battery, it is largely degraded in the conversion efficiency with the passage of time. It is known that there exist two types of degradations in the conversion efficiency with the passage of time, i.e., one is optical degradation caused by intense light irradiation and the other is thermal degradation caused at higher temperatures (refer to the Conference Record of the Eighteenth IEEE Photovoltaic Specialists Conference, 1985, pp. 1712-1713, Las Vegas, U.S.A.)

Incidentally, each of the U.S. Pat. Nos. 4,476,346 and 4,388,482 describes a photovoltaic device composed mainly of amorphous semiconductor film which includes a doped layer of hydrogenated amorphous silicon nitride (a—SiN:H) neighboring on a metal electrode. However, this doped layer is a single layer and does not include such sub-layers as will be described in the following.

SUMMARY OF THE INVENTION

In view of the prior art, it is a major object of the present invention to provide a photovoltaic device composed mainly of amorphous silicon which is improved in resistance to the thermal degradation of the conversion efficiency without deteriorating the initial conversion efficiency.

According to the present invention, a photovoltaic device comprises: a semiconductor film made mainly of amorphous silicon, the semiconductor film including a plurality of semiconductor layers which comprise at least one semiconductor-to-semiconductor junction, a transparent front electrode on one side of the semiconductor film, and a back electrode on the other side of the semiconductor film; wherein one end layer of the semiconductor layers which neighbors on the back electrode includes, at least one first type sub-layer of an alloyed amorphous silicon which contains not only hydrogen and a dopant for one conductivity type but also at least one element selected from nitrogen, oxygen and carbon, and at least one second type sub-layer of an amorphous silicon which contains hydrogen and a dopant for the one conductivity type.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
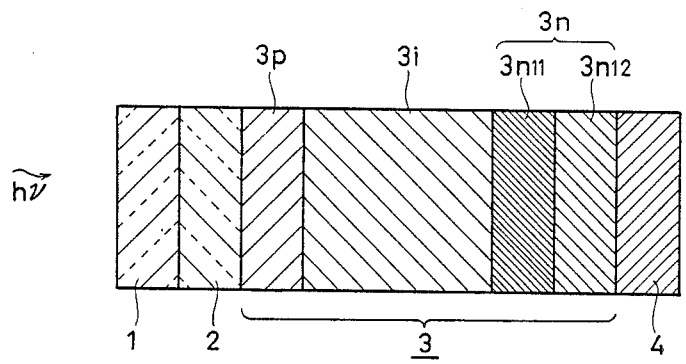
FIG. 1 is a schematic sectional view of a photovoltaic device according to a first embodiment of the present invention.

Referring to FIG. 1, a light incident front electrode 2 of a single layer or stacked layers of TCOs (transparent conductive oxide) such as ITO (indium tin oxide) and $SnO_2$, a semiconductor film 3 for receiving incident light through the front electrode and a back electrode 4 are stacked in this order on a substrate 1 of a transparent insulator such as glass. The back electrode 4 may comprise a layer of Al or Ag, or stacked layers of Ag/Ti, TCO/Ag or TCO/Ag/Ti.

The semiconductor film 3 comprises a p-layer $3p$, an i-layer $3i$ and an n-layer $3n$ stacked in this order on the transparent front electrode 2 thereby to compose a p-i-n junction. The p-layer $3p$ may be made of an amorphous silicon carbide which contains hydrogen and has a wide energy band gap, and it acts a so-caled window layer. The i-layer $3i$ may be made of a non-doped amorphous silicon containing hydrogen and it mainly generates pairs of free electrons and holes as electric charge carriers upon receiving light irradiation through the p-layer $3p$. The n-layer $3n$ includes a first type n-sub-layer $3n_{11}$ and a second type n-sub-layer $3n_{12}$ stacked in this order on the i-layer $3i$.

The first type n-sub-layer $3n_{11}$ may be made of an alloyed amorphous silicon which contains phosphorus as an n-type dopant, hydrogen as a terminator of the dangling bonds and at least one element selected from nitrogen, oxygen and carbon. On the other haand, the second type n-sub-layer $3n_{12}$ may be made of an amorphous silicon which contains phosphorus as an n-type dopant and hydrogen as a terminator of the dangling bonds. Hereinafter, amorphous silicon containing hydrogen will be referred to as hydrogenated amorphous silicon (a—Si:H), and also hydrogenated amorphous silicon containing nitrogen, oxygen or carbon will be referred to as hydrogenated amorphous silicon nitride (a—SiN:H), hydrogenated amorphous silicon oxide (a—SiO:H) or hydrogenated amorphous silicon carbide(a—SiC:H).

It is known that the chemical bonding force between silicon and nitrogen, oxygen or carbon is stronger than that of the silicon-to-silicon (Si—Si) bonding. In a conventional photovoltaic device, the n-layer is made of a—Si:H structured by the weak Si—Si bonding and thus an undesired element, e.g., a constituent element of the back electrode, diffuses from the back electrode into the semiconductor layers thereby causing the thermal degradation of the conversion efficiency when the device is held at a higher temperature for long time.

On the other hand, the n-layer 3n of a photovoltaic device of FIG. 1 contains Si—N, Si—Od and/or Si—C bonding stronger than Si—Si bonding and thus even though an undesired element diffuses from the back electrode 4 into the second type n-sub-layer $3n_{12}$, the first type n-sub-layer $3n_{11}$ will block the diffusion of the undesired element. Namely, the diffusion of the undesired element from the back electrode 4 is blocked within the n-layer 3n and then the undesired element cannot diffuse into the i-layer 3i.

The semiconductor film 3 can be formed, for example, by a plasma CVD (chemical vapor deposition) method with a radio frequency power source of 13.56 MHz. Table I typically shows the compositions of source gases and the layer thicknesses for the layer 3p, 3i and sub-layers $3n_{11}$, $3n_{12}$ in the semiconductor film 3. In this case, a—SiN:H is deposited for the first type n-sub-layer $3n_{11}$. These layers and sub-layers can be deposited under the conditions in which the substrate temperature is 150°–300° C.; the radio frequency power is 10–50 W; and the reaction chamber pressure is 0.1–0.5 Torr.

TABLE I

| Layer | Composition of Source Gas (%) | Layer Thickness (Å) |
|---|---|---|
| P-Layer | $\frac{CH_4}{SiH_4} = 10\sim70$ $\frac{B_2H_6}{SiH_4} = 0.1\sim0.5$ | 100~150 |
| I-Layer | $SiH_4 = 100$ | 2000~6000 |
| First Type N-Sub-Layer | $\frac{NH_3}{SiH_4} = 0.5\sim50$ $\frac{PH_3}{SiH_4} = 0.5\sim5$ | 50~200 |
| Second Type N-Sub Layer | $\frac{PH_3}{SiH_4} = 0.5\sim5$ | 50~200 |

Figure 2:
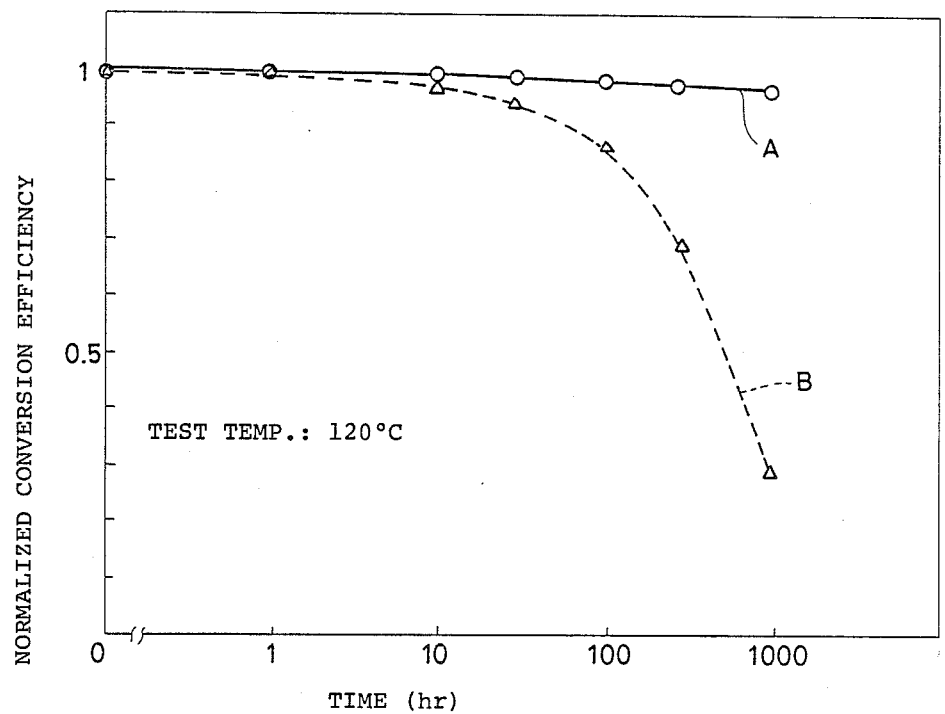
FIG. 2 is a graph showing the thermal degradation of the conversion efficency of the device of FIG. 1 and a conventional device both held at 120° C., with respect to the passage of time.

Referring to FIG. 2, there are shown the respective thermal degradation curves A and B of the conversion efficiency with the passage of time of the device of FIG. 1 and a conventional device, both held at 120° C. In the device of FIG. 1, the semiconductor film 3 was sandwiched between a front electrode 2 of TCO and a back electrode 4 of Al. The first type n-sub-layer $3n_{11}$ was made of a—SiN:H containing 25 at.%N and had a thickness of about 150 Å. The second type n-sub-layer $3n_{12}$ was made of a—Si:H and had a thickness of about 150 Å. In the meantime, the conventional device was similarly constituted except that the n-layer was a single layer of a—Si:H and had a thickness of about 300 Å. The initial values of the conversion efficiency of the device of FIG. 1 and the conventional device were 8.99% and 9.05% respectively, and thus almost the same. In FIG. 2, the thermal degradation curves A and B of the conversion efficiency are shown normalized to the respective initial values. The conversion efficiency to the device of FIG. 1 is degraded a little to 8.72% after 1000 hrs only and at that point the degradation ratio is only 3% as seen from the solid line A in FIG. 2. On the other hand, the conversion efficiency of the conventional device is very substantially degraded to 2.72% after 1000 hrs. and at that point the degradation ratio is as large as 70% as seen from the broken line B in FIG. 2.

Incidentally, although not shown in FIG. 2, a comparative device was also made similarly to the device of FIG. 1, except that the n-layer was a single layer of a—SiN:H containing 25 at.%N and had a thickness of about 300 Å. Although the comparative device showed a small degradation ratio of 2% in the conversion efficiency after being held at 120° C. for 1000 hrs, the absolute value of the conversion efficiency was as low as 7.15% in the initial state and as low as 7.01% after the degradation.

In conclusion, it is understood that in the device of FIG. 1 the sub-layer $3n_{11}$ of a—SiN:H is effective in preventing the thermal degradation of the conversion efficiency while the sub-layer $3n_{12}$ of a—Si:H prevents the initial value of the conversion efficiency from being lowered.

Figure 3A:
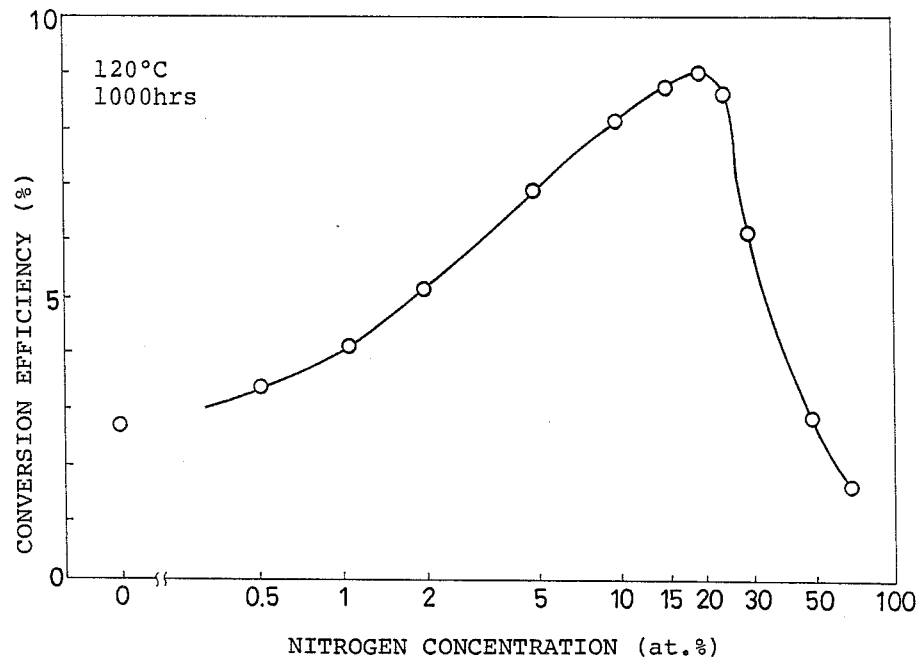
FIGS. 3A, 3B and 3C are graphs showing the conversion efficiency of the device of FIG. 1 after being held at 120° C. for 1000 hrs, with respect to the nitrogen, oxygen and carbon concentrations, respectively, in the first type n-sub-layer $3n_{11}$.
Figure 3B:
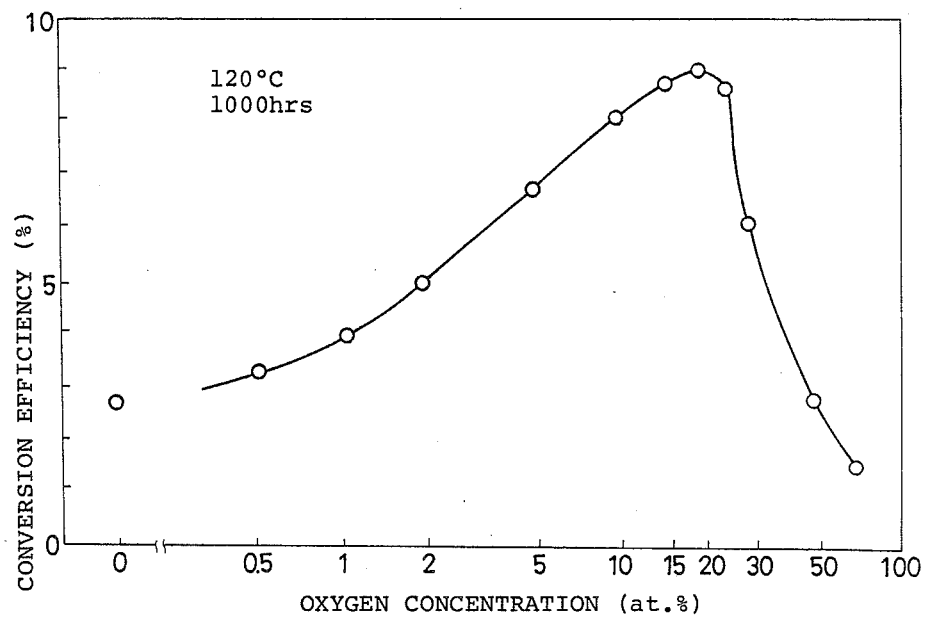
Figure 3C:
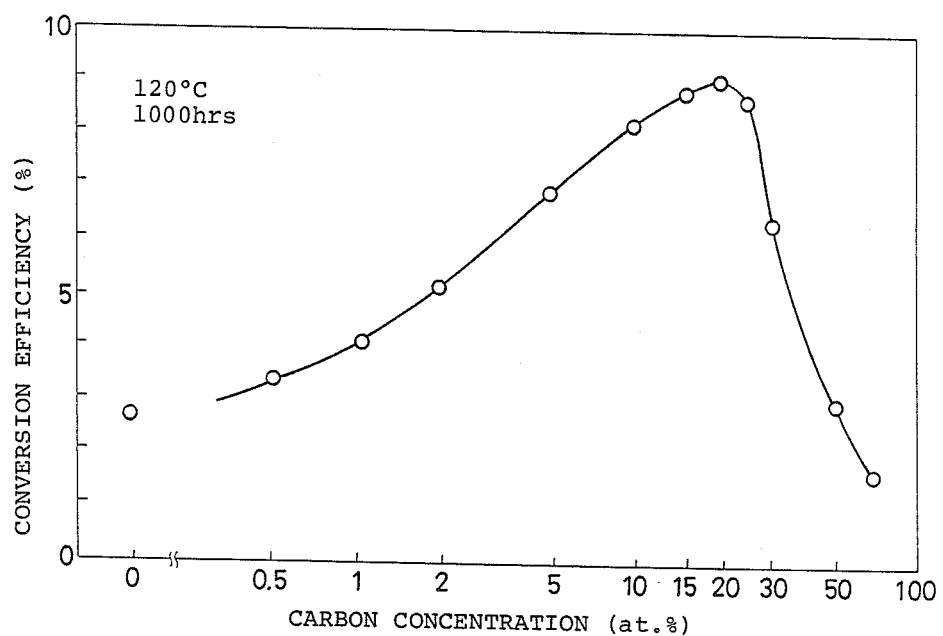

Referring to FIG. 3A, there is shown the conversion efficiency of the device of FIG. 1 after being held at 120° C. for 1000 hrs, with respect to the nitrogen concentration in the first type sub-layer $3n_{11}$. As seen in this figure, the conversion efficiency is maintained at a high value after the degradation test when the nitrogen is present in the concentration range of 10–25 at.%. FIGS. 3B and 3C are similar to FIG. 3A, but show the conversion efficiency with respect to the oxygen concentration and the carbon concentration, respectively.

Referring to FIGS. 4 to 7, there are shown second to fifth embodiments, in which only the respective n-layers 3n are modified.

Figure 4:
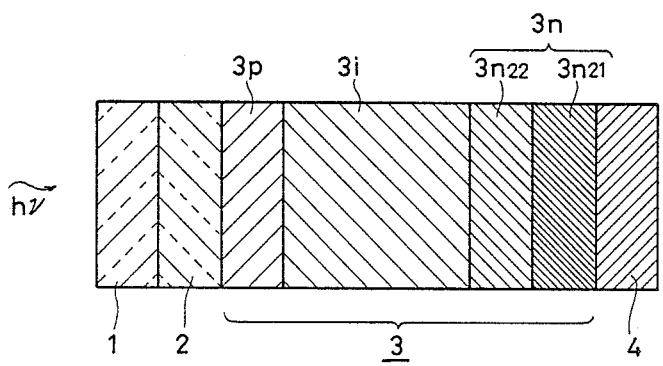
FIGS. 4 to 7 are schematic sectional views of photovoltaic devices, according to second to fifth embodiments, respectively, of the present invention.

In the second embodiment of FIG. 4, although the n-layer 3n includes two n-sub-layers similarly to that of FIG. 1, a first type n-sub-layer $3n_{21}$ and a second type n-sub-layer $3n_{22}$ are stacked in reverse order. Namely, the first type sub-layer $3n_{21}$ of a—SiN:H, a—SiO:H, a—SiC:H or a—SiNO:H is contiguous to the back electrode 4, and the second type sub-layer $3n_{22}$ of a—Si:H is contiguous to the i-layer 3i.

Figure 5:
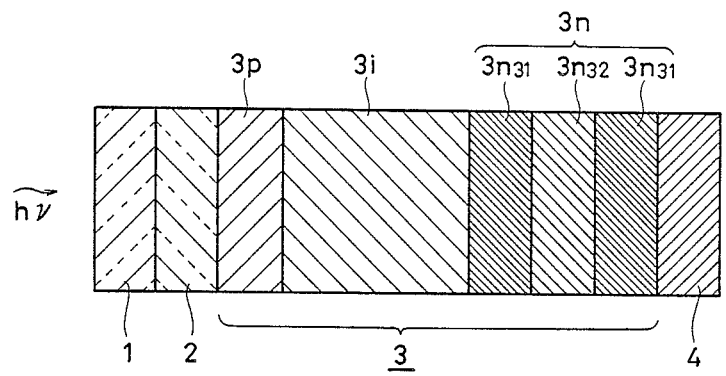

In the third embodiment of FIG. 5, the n-layer 3n includes three n-sub-layers, wherein a second type n-sub-layer $3n_{32}$ is sandwiched between two first type n-sub-layers $3n_{31}$.

Figure 6:
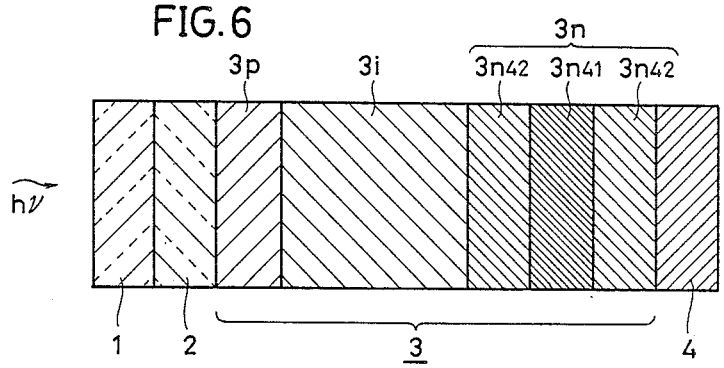

In the fourth embodiment of FIG. 6, although the n-layer 3n also includes three n-sub-layers similarly to that of FIG. 5, a first type n-sub-layer $3n_{41}$ is sandwiched between two second type n-sub-layers $3n_{42}$.

Figure 7:
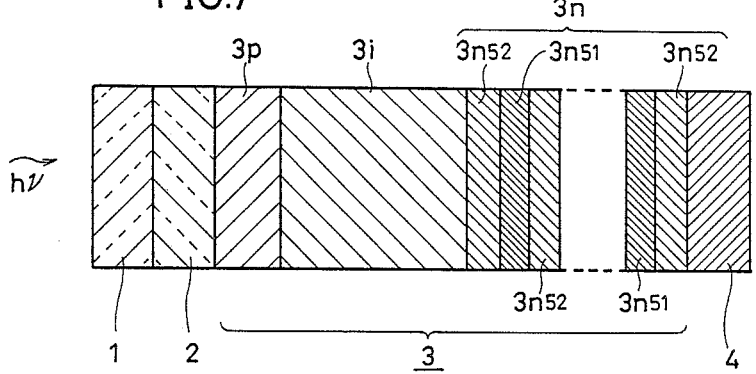

In the fifth embodiment of FIG. 7, the n-layer 3n includes more than three n-sub-layers, wherein first type n-sub-layers $3n_{51}$ and second type n-sub-layers $3n_{52}$ are alternately stacked on the i-layer 3i. In this case, either one of these sub-layers $3n_{51}$ and $3n_{52}$ may be located contiguous to the i-layer 3i. Taking the i—n interfacial characteristic into consideration, however, it is more preferable that one of the second type sub-layers $3n_{52}$ is contiguous to the i-layer 3i. Similarly, taking into consideration the interfacial characteristic between the n-layer 3n and the back electrode 4, it also is more preferable that one of the second type sub-layers $3n_{52}$ is contiguous to the back electrode 4. Therefore, it is most preferable that the n-layer 3n includes an odd number of the alternately stacked sub-layers $3n_{51}$, $3n_{52}$ starting with a sub-layer of the second type $3n_{52}$ and ending with another sub-layer of the same type.

Table II shows the data of initial open-circuit voltage Voc, initial short-circuit current Isc, initial fill factor FF, initial conversion efficiency $\eta o$, degraded conversion efficiency $\eta t$ after the degradation test at 120° C. for 1000 hrs and thermal degradation ratio $(1 - \eta t/\eta o)$ in the first to fifth embodiments, in which every first type n-sub-layer is made of a—SiN:H containing 25 at. %N. For comparison, Table II also shows similar data for the above described conventional and comparative devices. Each device shown in Table II comprises an n-layer 3n having a thickness of about 300 Å. In each of the first to fifth embodiments, the n-sub-layers have the same thickness. Namely, each of the two n-sub-layers has a thickness of 150 Å in the first and second embodiments, and each of the three n-sub-layers has a thickness of 100 Å in the third and fourth embodiments. In the fifth embodiment, the n-layer 3n includes eleven n-sub-layers $3n_{51}$ and $3n_{52}$ which are alternately stacked starting with one of the second type sub-layer $3n_{52}$ of a—Si:H and ending with another of the same type. Each of these sub-layers $3n_{51}$ and $3n_{52}$ has a thickness of about 27 Å.

TABLE II

|  | Voc (V) | Isc (mA/cm$^2$) | FF | $\eta o$ (%) | $\eta t$ (%) | $1 - \eta t/\eta o$ |
|---|---|---|---|---|---|---|
| First Embodiment | 0.87 | 15.2 | 0.68 | 8.99 | 8.72 | 0.03 |
| Second Embodiment | 0.87 | 15.0 | 0.68 | 8.87 | 8.69 | 0.02 |
| Third Embodiment | 0.86 | 15.2 | 0.68 | 8.89 | 8.71 | 0.02 |
| Fourth Embodiment | 0.88 | 15.1 | 0.69 | 9.17 | 8.80 | 0.04 |
| Fifth Embodiment | 0.88 | 15.3 | 0.69 | 9.29 | 9.20 | 0.01 |
| Conventional Device | 0.88 | 14.9 | 0.69 | 9.05 | 2.72 | 0.70 |
| Comparative Device | 0.82 | 14.3 | 0.61 | 7.15 | 7.01 | 0.02 |

As appreciated from Table II, the devices according to the first to fifth embodiments are improved in resistance to the thermal degradation without deteriorating the initial photoelectric conversion characteristics. Particularly, according to the fifth embodiment, a very high absolute value of 9.20% for the conversion efficiency was obtained even after the degradation test. It seems that this high conversion efficiency was brought about by the super-lattice effect due to the extremely thin sub-layers $3n_{51}$, $3n_{52}$ stacked alternately.

Although the semiconductor film 3 contains one p-i-n junction in each of the above described embodiments, the present invention is applicable to a tandem type device containing two or more p-i-n junctions. In the tandem type device, a doped semiconductor layer neighboring on the back electrode includes at least one of the first type sub-layers of a—SiN:H, a—SiO:H, a—SiC:H or a—SiNO:H and at least one of the second type sub-layers of a—Si:H.

Further, the p-layer and n-layer may be exchanged with each other. In this case, the p-layer neighboring on the back electrode includes the p-sub-layers.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. A photovoltaic device comprising:
    a semiconductor film made mainly of amorphous silicon, said semiconductor film including a plurality of semiconductor layers which comprise at least one semiconductor-to-semiconductor junction,
    a transparent front electrode on one side of said semiconductor film, and
    a back electrode on the other side of said semiconductor film;
    wherein one end layer of said semiconductor layers which neighbors on said back electrode includes,
    at least one first type sub-layer of an alloyed amorphous silicon which contains not only hydrogen and a dopant for one conductivity type but also at least one element selected from the group of nitrogen and oxygen so as to provide a conversion efficiency which is improved in resistance to thermal degradation, and
    at least one second type sub-layer of an amorphous silicon which contains hydrogen and a dopant for said one conductivity type, but which is substantially free of said at least one element selected from the group consisting of nitrogen and oxygen.

2. A photovoltaic device in accordance with claim 1, wherein a plurality of said first type and second type sub-layers are stacked alternately.

3. A photovoltaic device in accordance with claim 1, wherein said semiconductor-to-semiconductor junction is a p-i-n junction.

4. A photovoltaic device in accordance with claim 3, wherein said photovoltaic device is of a tandem type and said semiconductor film contains a plurality of p-i-n junctions.

5. A photovoltaic device in accordance with claim 1, wherein said first type sub-layer contains at least one selected from the group consisting of nitrogen and oxygen in the concentration range of less than 50 at.%.

6. A photovoltaic device in accordance with claim 5, wherein said first type sub-layer contains at least one selected from the group consisting of nitrogen and oxygen more preferably in the oncentration range of 3 at.% to 30 at.%.

7. A photovoltaic device in accordance with claim 6, wherein said first type sub-layer contains at least one selected from the group consisting of nitrogen and oxygen most preferably in the concentration range of 10 at.% to 25 at.%.

8. A photovoltaic device in accordance with claim 1, wherein said back electrode comprises a layer of one selected from the group consisting of Al and Ag.

9. A photovoltaic device in accordance with claim 1, wherein said back electrode comprises stacked layers of one selected from the group consisting of Ag/Ti, TCO/Ag, and TCO/Ag/Ti.

10. A photovoltaic device comprising;
    a semiconductor film made mainly of amorphous silicon, said semiconductor film including a plurality of semiconductor layers which comprise at least one semiconductor-to-semiconductor junction,
    a transparent front electrode on one side of said semiconductor film, and
    a back electrode on the other side of said semiconductor film;
    wherein one end layer of said semiconductor layers which neighbors on said back electrode includes,
    at least one first type sub-layer of an alloyed amorphous silicon which contains not only hydrogen and a dopant for one conductivity type but also at least one element selected from the group of nitrogen and oxygen so as to provide a conversion efficiency which is improved in resistance to thermal degradation, and
    at least one second type sub-layer of an amorphous silicon which contains hydrogen and a dopant for said one conductivity type, with said back electrode being contiguous to said second type sub-layer, but which is substantially free of said at least one element selected from the group consisting of nitrogen and oxygen.

11. A photovoltaic device in accordance with claim 10, wherein a plurality of said first type and second type sub-layers are stacked alternately.

12. A photovoltaic device in accordance with claim 10, wherein said semiconductor-to-semiconductor junction is a p-i-n junction.

13. A photovoltaic device in accordance with claim 12, wherein said photovoltaic device is of a tandem type and said semiconductor film contains a plurality of p-i-n junctions.

14. A photovoltaic device in accordance with claim 10, wherein said first type sub-layer contains at least one selected from the group consisting of nitrogen and oxygen in the concentration range of less than 50 at.%.

15. A photovoltaic device in accordance with claim 14, wherein said first type sub-layer contains at least one selected from the group consisting of nitrogen and oxygen more preferably in the concentration range of 3 at.% to 30 at.%.

16. A photovoltaic device in accordance with claim 15, wherein said first type sub-layer contains at least one selected from the group consisting of nitrogen and oxygen most preferably in the concentration range of 10 at.%. to 25 at.%.

17. A photovoltaic device in accordance with claim 10, wherein said back electrode comprises a layer of one selected from the group consisting of Al and Ag.

18. A photovoltaic device in accordance with claim 10, wherein said back electrode comprises stacked layers of one selected from the group consisting of Ag/Ti, TCO/Ag, and TCO/Ag/Ti.

* * * * *